United States Patent
Verma et al.

(10) Patent No.: US 10,347,710 B2
(45) Date of Patent: Jul. 9, 2019

(54) THIN FILM RESISTOR METHODS OF MAKING CONTACTS

(71) Applicant: GLOBALFOUNDRIES Singapore Pte. Ltd., Singapore (SG)

(72) Inventors: Purakh Raj Verma, Singapore (SG); Kemao Lin, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/446,079

(22) Filed: Mar. 1, 2017

(65) Prior Publication Data
US 2018/0254315 A1    Sep. 6, 2018

(51) Int. Cl.
| H01L 49/02 | (2006.01) |
| H01L 21/768 | (2006.01) |
| H01L 21/3205 | (2006.01) |
| H01L 23/522 | (2006.01) |
| H01L 23/532 | (2006.01) |

(52) U.S. Cl.
CPC ........ *H01L 28/24* (2013.01); *H01L 21/32051* (2013.01); *H01L 21/76802* (2013.01); *H01L 21/76834* (2013.01); *H01L 21/76877* (2013.01); *H01L 23/5226* (2013.01); *H01L 23/5228* (2013.01); *H01L 23/53228* (2013.01)

(58) Field of Classification Search
CPC .......... H01L 21/0217; H01L 21/32051; H01L 21/3212; H01L 21/76802; H01L 21/76814; H01L 21/76807; H01L 21/76877; H01L 2221/1036; H01L 28/24; H01L 23/5228
See application file for complete search history.

(56) References Cited

U.S. PATENT DOCUMENTS

| 4,682,143 A | 7/1987 | Chu et al. |
| 6,171,922 B1 | 1/2001 | Maghsoudnia |
| 2004/0152256 A1* | 8/2004 | Noguchi ........... H01L 21/76801 438/250 |
| 2004/0152299 A1* | 8/2004 | Mahalingam .......... H01C 7/006 438/637 |
| 2009/0023263 A1* | 1/2009 | Phan ....................... H01L 28/20 438/384 |
| 2009/0309186 A1* | 12/2009 | Inoue .................. H01L 23/5223 257/532 |

* cited by examiner

*Primary Examiner* — Wael M Fahmy
*Assistant Examiner* — Sarah K Salerno
(74) *Attorney, Agent, or Firm* — Ditthavong & Steiner, P.C.

(57) ABSTRACT

A method for forming a thin film resistor (TFR) without via penetration and the resulting device are provided. Embodiments include forming a first ILD over a substrate; forming a second ILD over the first ILD; forming a first metal layer in the second ILD; forming a first nitride layer over the second ILD and the first metal layer; forming a third ILD over the first nitride layer; forming vias through the third ILD and the first nitride layer, coupled to the first metal layer; forming a TFR layer over two of the vias and the third ILD between the two vias; forming a second nitride layer over the TFR layer and the third ILD; forming a fourth ILD over the second nitride layer; and forming a second metal layer in the fourth ILD and the second nitride layer.

6 Claims, 13 Drawing Sheets

FIG. 3
BACKGROUND

THIN FILM RESISTOR METHODS OF MAKING CONTACTS

TECHNICAL FIELD

The present disclosure relates to the manufacture of semiconductor devices, such as integrated circuits (ICs). The present disclosure is particularly applicable to ICs with thin film resistor (TFR) structures.

BACKGROUND

Figure 3:
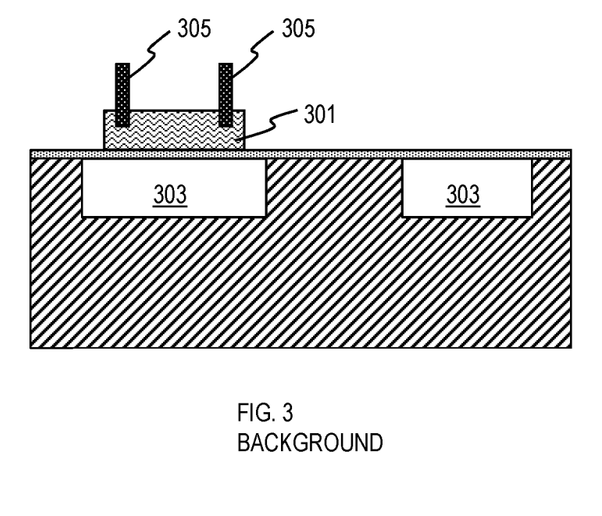
FIG. 3 schematically illustrates a conventional polysilicon resistor.

The integration of TFRs in semiconductor devices enables resistance to relatively large current density. As illustrated in FIG. 3, a conventional polysilicon resistor 301 is formed over STI 303. Contacts 305 are formed directly on the resistor. In order to attain high resistance, the TFRs normally are formed to a very thin thickness of between 30 Angstrom (Å) to 300 Å. Furthermore, in some high precision applications, there is a need for resistors with very closely matched resistance. Hence it is important that the resistance of integrated TFRs is controllable and predictable during the fabrication process. However, vias (for forming the contacts) formed directly over the TFRs can easily penetrate through the thin TFRs, causing undesirable variance in the end contact resistance. This leads to a mismatch of the TFRs and results in deteriorated TFR reliability and overall circuit performance.

In a conventional process, material 117 typically has low temperature coefficient. Examples of material 117 include tantalum (Ta), tantalum nitride (TaN), silicon chromium (SiCr), or nickel chromium (NiCr). Etching of material 117 typically requires special etching chemistry and equipment, hence special equipment such as a RIE etcher may be needed, or tool dedication specific for the etch process may be practiced. This could pose a significant increase in the manufacturing cost.

A need therefore exists for methodology enabling manufacture of a TFR without via penetration and the resulting device.

SUMMARY

An aspect of the present disclosure is a method of forming a TFR in association with a via single damascene process.

Another aspect of the present disclosure is a method of forming a TFR in association with a metal single damascene process.

Another aspect of the present disclosure is a device including a TFR with contacts below the TFR formed in association with a via single damascene process.

Another aspect of the present disclosure is a device including a TFR with contacts below the TFR formed in association with a metal single damascene process.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a first interlayer dielectric (ILD) over a substrate; forming a second ILD over the first ILD; forming a first metal layer in the second ILD; forming a first nitride layer over the second ILD and the first metal layer; forming a third ILD over the first nitride layer; forming vias through the third ILD and the first nitride layer, coupled to the first metal layer; forming a TFR layer over two of the vias and the third ILD between the two vias; forming a second nitride layer over the TFR layer and the third ILD; forming a fourth ILD over the second nitride layer; and forming a second metal layer in the fourth ILD and the second nitride layer.

Another aspect includes forming the first metal layer by a single damascene process. Further aspects include forming the second metal layer by a single or dual damascene process. Additional aspects include forming each of the first and second metal layers to a thickness of 2,000 Å to 10,000 Å. Other aspects include forming each of the first and the second nitride layers of silicon nitride ($Si_3N_4$) and to a thickness of 300 Å to 1,000 Å. Further aspects include forming the TFR layer to a thickness of 50 Å to 2,000 Å, depending upon the temperature coefficient of resistance (TCR) and sheet resistance requirements. The TFR layer includes Ta, TaN, SiCr, or NiCr.

Another aspect of the present disclosure include forming a first ILD over a substrate; forming a second ILD over the first ILD; forming a first metal layer in the second ILD; forming a first nitride layer over the second ILD and the first metal layer; forming a third ILD over the first nitride layer; forming vias through the third ILD and the first nitride layer, coupled to the first metal layer; forming a second nitride layer over the third ILD and the vias; forming a fourth ILD over the second nitride layer; forming a second metal layer in the fourth ILD and the second nitride layer; forming a third nitride layer over the fourth ILD and the second metal layer; removing a portion of the third nitride layer, the fourth ILD and the second nitride layer over and between two of the vias, forming a trench; forming a TFR layer over side and bottom surfaces of the trench; forming a fifth ILD over the TFR layer in the trench; forming a sixth ILD over the third nitride layer, the TFR layer and the fifth ILD; and forming a via through the sixth ILD and the third nitride layer coupled to the second metal layer.

Another aspect includes forming the first metal layer by single or dual damascene. Further aspects include forming the second metal layer by single damascene. Additional aspects include forming each of the first and second metal layers to a thickness of 2,000 Å to 10,000 Å. Other aspects include forming each of the first, second, and third nitride layers of $Si_3N_4$ and to a thickness of 300 Å to 1,000 Å. Further aspects include forming the TFR layer of Ta, TaN, SiCr, or NiCr using a deposition and a chemical mechanical planarization (CMP) process to a thickness of 50 Å to 2,000 Å.

A further aspect of the present disclosure is a device including: a first ILD over a substrate; a second ILD over the first ILD; a first metal layer in the second ILD; a first nitride layer over the second ILD and the first metal layer; a third ILD over the first nitride layer; vias in the third ILD and the first nitride layer coupled to the first metal layer; a TFR layer over two of the vias and the third ILD between the two vias; a second nitride layer over the TFR layer and the third ILD; a fourth ILD over the second nitride layer; and a second metal layer in the fourth ILD and the second nitride layer.

Aspects of the device include each of the first, second, third, and fourth ILDs having a thickness of 3,000 Å to 20,000 Å. Other aspects include the TFR layer over contacts or the vias having a thickness of 50 Å to 2,000 Å. A further aspect includes each of the first and second nitride layers having a thickness of 300 Å to 1,000 Å.

Another aspect of the device include a first ILD over a substrate; a second ILD over the first ILD; a first metal layer in the second ILD; a first nitride layer over the second ILD and the first metal layer; a third ILD over the first nitride layer; vias in the third ILD and the first nitride layer coupled to the first metal layer; a second nitride layer over the third ILD and the vias; a fourth ILD over the second nitride layer; a second metal layer in the fourth ILD and the second nitride layer; a third nitride layer over the fourth ILD and the second metal layer; a trench in the second nitride layer, the fourth ILD, and the third nitride layer, separated from the second metal layer and over two of the vias and the third ILD between the two vias; a TFR layer on side and bottom surfaces of the trench; a fifth ILD over the TFR layer in the trench; a sixth ILD over the third nitride layer, the TFR layer and the fifth ILD; and a via in the sixth ILD and the third nitride layer coupled to the second metal layer.

Aspects of the device include each of the first, second, third, fourth, fifth and sixth ILDs having a thickness of 3,000 Å to 20,000 Å. Other aspects include the TFR layer over contacts or the vias having a thickness of 50 Å to 1,000 Å. A further aspect includes each of the first, second, and third nitride layers having a thickness of 300 Å to 1,000 Å.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of end contact resistance variation attendant upon vias being formed above and penetrating into conventional polysilicon resistors and TFR and the manufacturing cost due to etcher dedication. In accordance with embodiments of the present disclosure, via and metal dual damascene processes are changed to a single damascene process and the TFR is formed over the vias rather than the vias being formed over the TFR. In one example embodiment, a TFR is formed after a via process but before the metal process, wherein resistor connection is made through vias and metal layer underneath the TFR. In another example embodiment, a TFR is formed after the metal process, wherein resistor connection is made through vias and metal layer underneath the TFR.

Methodology in accordance with embodiments of the present disclosure includes forming first and second ILDs over a substrate. Next, a first metal layer is formed in the second ILD. Subsequently, a first nitride layer is formed over the second ILD and the first metal layer, and a third ILD is formed over the first nitride layer. Vias are then formed through the third ILD and the first nitride layer, coupled to the first metal layer. Next, a TFR layer is formed over two of the vias and the third ILD between the two vias. Subsequently, a second nitride layer is formed over the TFR layer and the third ILD. Thereafter, a fourth ILD is formed over the second nitride layer. Finally, a second metal layer is formed in the fourth ILD and the second nitride layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1F schematically illustrate a process flow for via single damascene, in accordance with an exemplary embodiment. In this embodiment, a TFR is formed after a via process but before a metal process, and a resistor connection is made through the via and metal layer underneath the TFR. Adverting to FIG. 1A, an ILD 103 is formed to a thickness of 3,000 Å to 20,000 Å over the silicon substrate 101. Then, source/drain contacts (CAs) 105 are formed through the ILD 103 by reactive ion etching (RIE) and filled with metal, such as Tungsten (W). (Only one CA is shown for illustrative convenience). Next, an ILD 107 is formed to a thickness of 3,000 Å to 20,000 Å over the ILD 103 and the CAs 105. Subsequently, a metal layer 109 is formed to a thickness of 2,000 Å to 10,000 Å in the ILD 107. The metal layer 109 is formed by single damascene, wherein portions of the ILD 107 over the ILD 103 and the CAs 105 are removed by RIE to form trenches, which are then filled with a metal such as copper (Cu), and chemical mechanical planarization (CMP) is performed to remove the excess Cu. Thereafter, a nitride layer 111 is formed to a thickness of 300 Å to 1,000 Å over the ILD 107 and the metal layer 109. The nitride layer 111 may be formed of $Si_3N_4$.

Figure 1A:
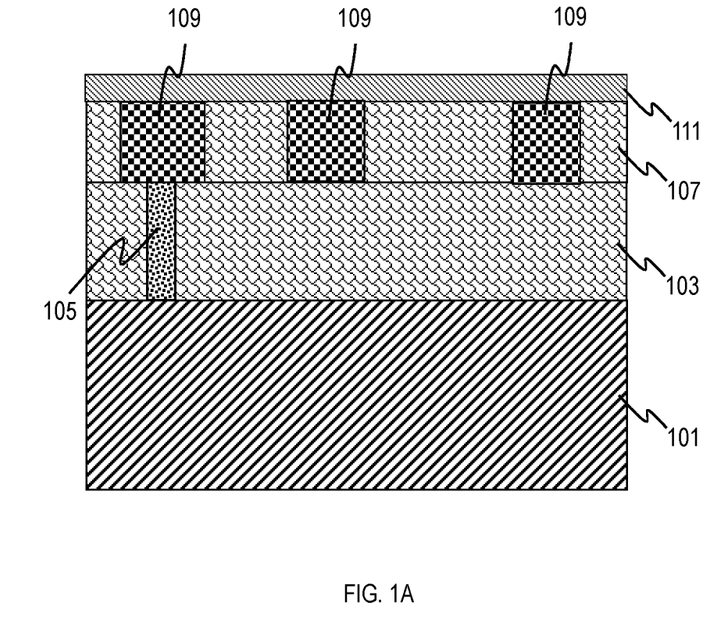
FIG. 1A through 1F schematically illustrate a flow for via single damascene process, in accordance with an exemplary embodiment.
Figure 1B:
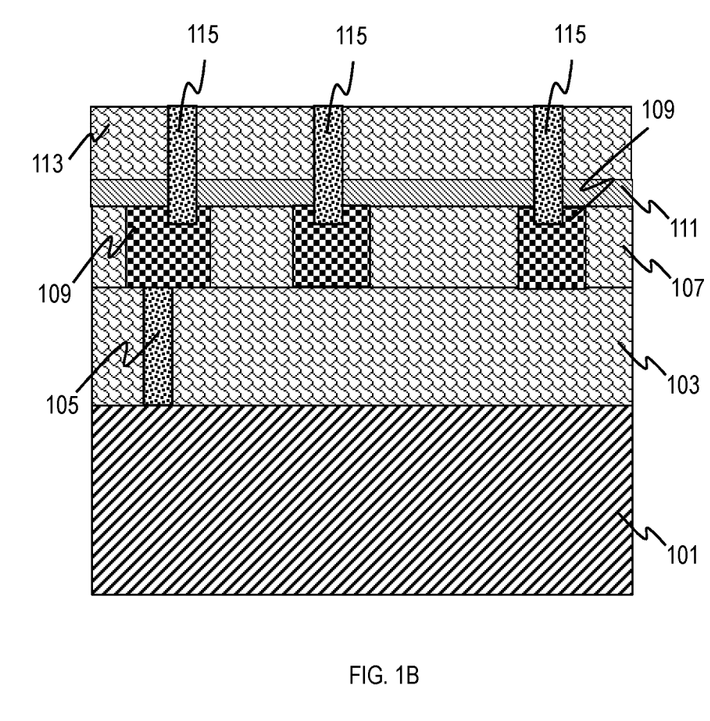
Figure 1C:
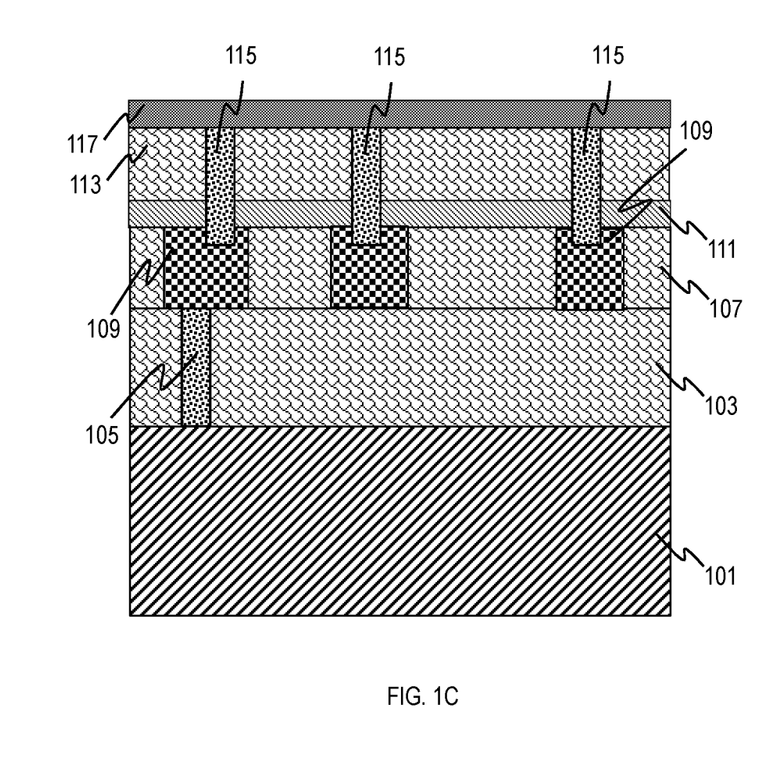
Figure 1D:
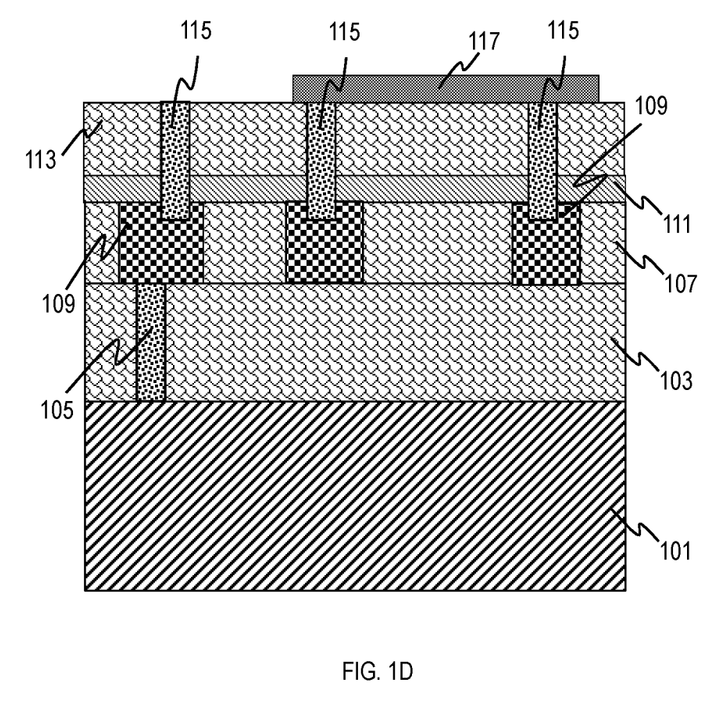

Next, as illustrated in FIG. 1B, an ILD 113 is formed to a thickness of 3,000 Å to 20,000 Å over the nitride layer 111. Subsequently, vias 115 are formed by RIE through the ILD 113 and the nitride layer 111 and coupled to the metal layer 109 by filling with metal (i.e., a single damascene process). Adverting to FIG. 1C, a TFR layer 117 is formed to a thickness of 50 Å to 1,000 Å over the ILD 113 and the vias 115. The TFR layer 117 is formed of Ta, TaN, SiCr, or NiCr. Thereafter, as shown in FIG. 1D, the TFR layer 117 is patterned and etched by RIE or wet etching, leaving the TFR layer 117 over two of the vias 115 and the ILD 113 between the two vias.

Figure 1E:
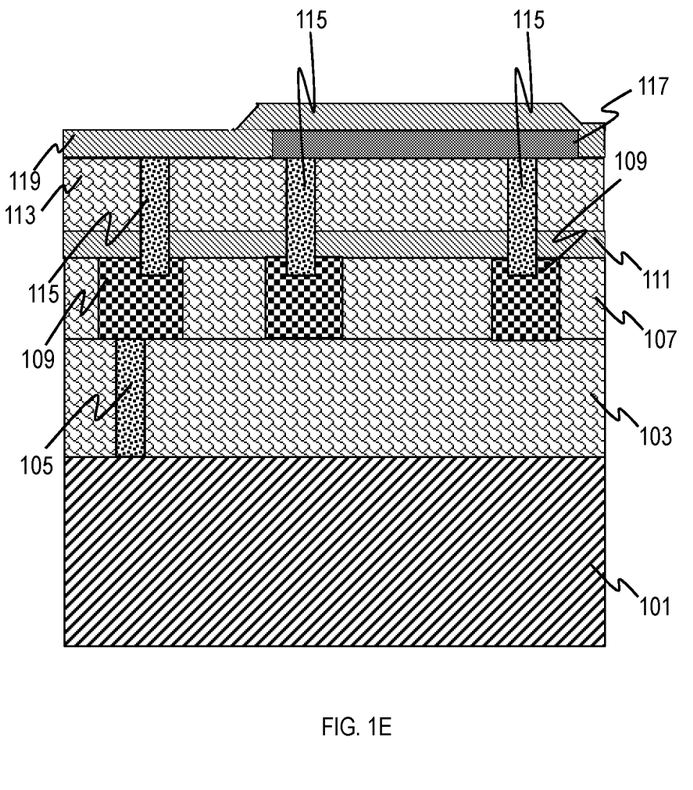
Figure 1F:
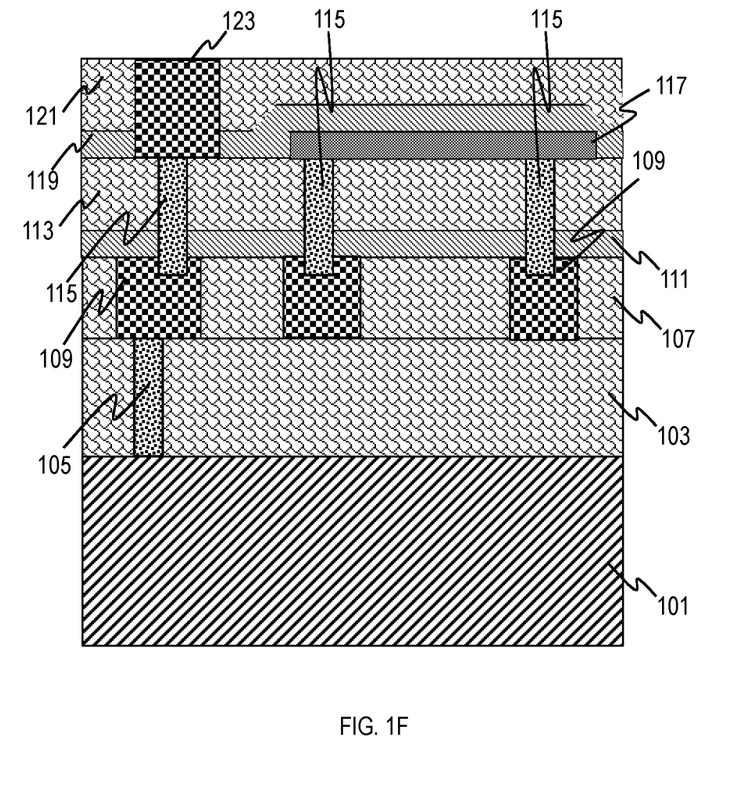

A nitride layer 119 is then formed to a thickness of 300 Å to 1,000 Å over the TFR layer 117 and the ILD 113, as illustrated in FIG. 1E. The nitride layer 119 may be formed of $Si_3N_4$. Adverting to FIG. 1F, ILD 121 is formed to a thickness of 3,000 Å to 20,000 Å over the nitride layer 119. Next, a metal layer 123 is formed to a thickness of 2,000 Å to 10,000 Å in the ILD 121 and the nitride layer 119 by using a single damascene process wherein a portion of the ILD 121 and the nitride layer 119 over one of the via 115 is etched by RIE to form a trench. Then, the trench is filled with Cu, and CMP is performed to remove excess Cu. Alternatively, vias 115 not used as contacts for the resistor may be formed after ILD 121 is deposited along with trenches for metal layer 123, and the vias and metal layer trenches may be filled together (i.e., by the dual damascene process described above). TFR alternatively may be formed over the contacts rather than over the vias for electrical connection.

FIG. 2A through 2F schematically illustrate a process flow for metal single damascene, in accordance with an exemplary embodiment. In this embodiment, a TFR is formed after the metal process. A resistor connection is made through the via and metal layer underneath the TFR. Adverting to FIG. 2A, an ILD 203 is formed to a thickness of 3,000 Å to 20,000 Å over the substrate 201. Then, CAs 205 are formed through the ILD 203 by RIE and filled with metal, such as tungsten (W). Next, an ILD 207 is formed to a thickness of 3,000 Å to 20,000 Å over the ILD 203 and the CAs 205. Subsequently, a metal layer 209 e.g. of Cu is formed by a single damascene process to a thickness of 2,000 Å to 10,000 Å in the ILD 207. Thereafter, a nitride layer 211 is formed to a thickness of 300 Å to 1,000 Å over the ILD 207 and the metal layer 209. The nitride layer 211 may be formed of $Si_3N_4$.

Figure 2A:
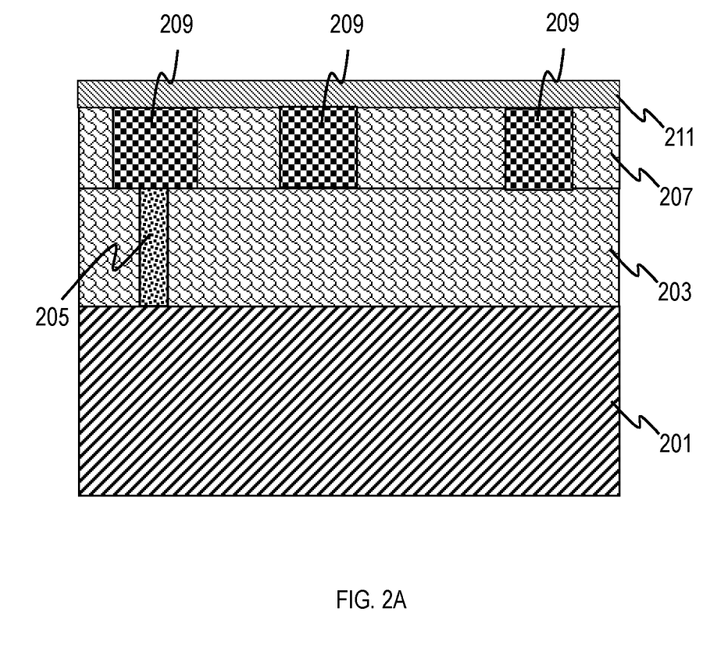
FIG. 2A through 2F schematically illustrate a flow for metal single damascene process, in accordance with an exemplary embodiment.
Figure 2B:
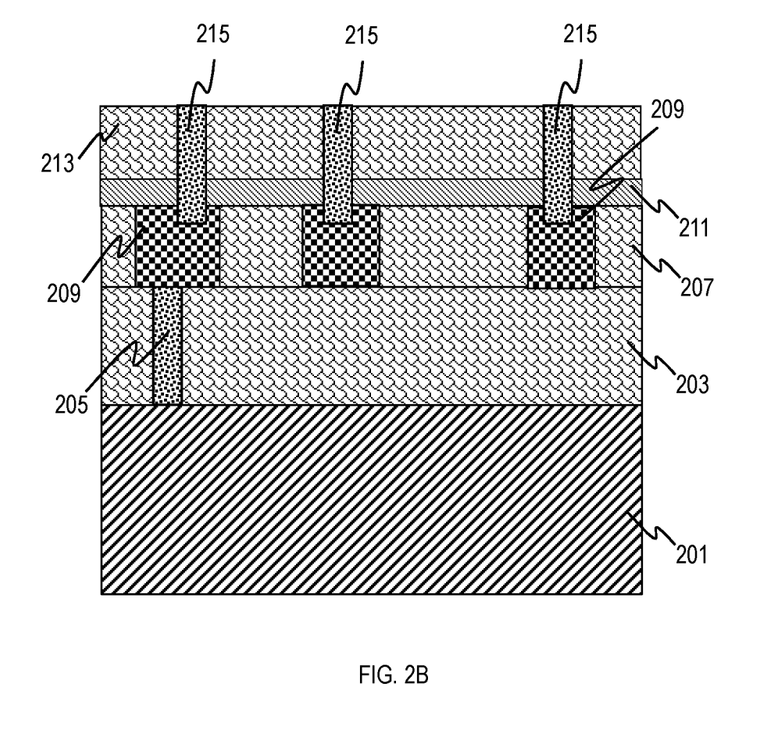
Figure 2C:
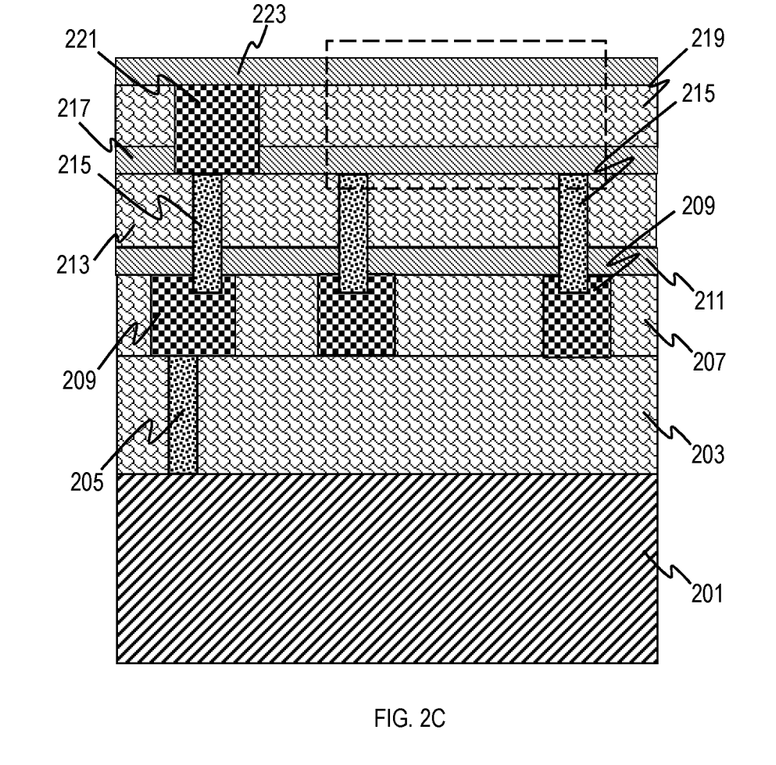

As illustrated in FIG. 2B, an ILD 213 is formed to a thickness of 3,000 Å to 20,000 Å over the nitride layer 211. Vias 215 are formed by RIE through the ILD 213 and the nitride layer 211 and filled with metal to couple to the metal layer 209. Next, as illustrated in FIG. 2C, a nitride layer 217 is formed to a thickness of 300 Å to 1,000 Å over the ILD 213 and the vias 215. The nitride layer 217 may be formed of $Si_3N_4$. Then, ILD 219 is formed to a thickness of 3,000 Å to 20,000 Å over the nitride layer 217. A metal layer 221 is formed to a thickness of 2,000 Å to 10,000 Å in the ILD 219 and the nitride layer 217. The metal layer 221 is formed by single damascene, wherein a portion of the ILD 219 and the nitride layer 217 over at least one of the vias 215 is etched by RIE to form a trench. Then, the trench is filled with Cu, and CMP is performed to remove excess Cu. Thereafter, a nitride layer 223 is formed to a thickness of 300 Å to 1,000 Å over the ILD 219 and the metal layer 221. The nitride layer 223 may be formed of $Si_3N_4$.

Figure 2D:
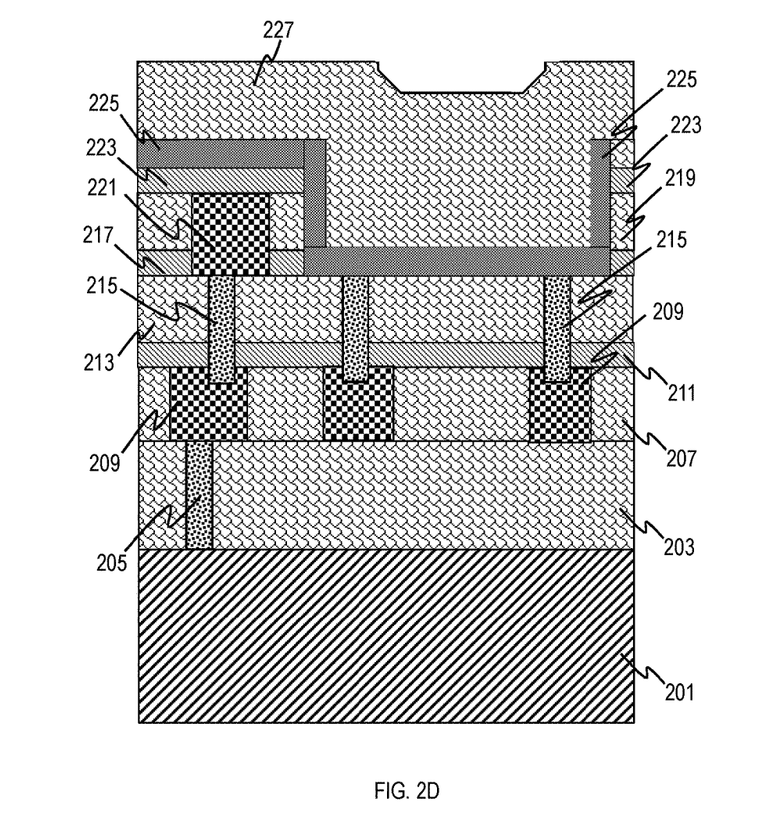
Figure 2E:
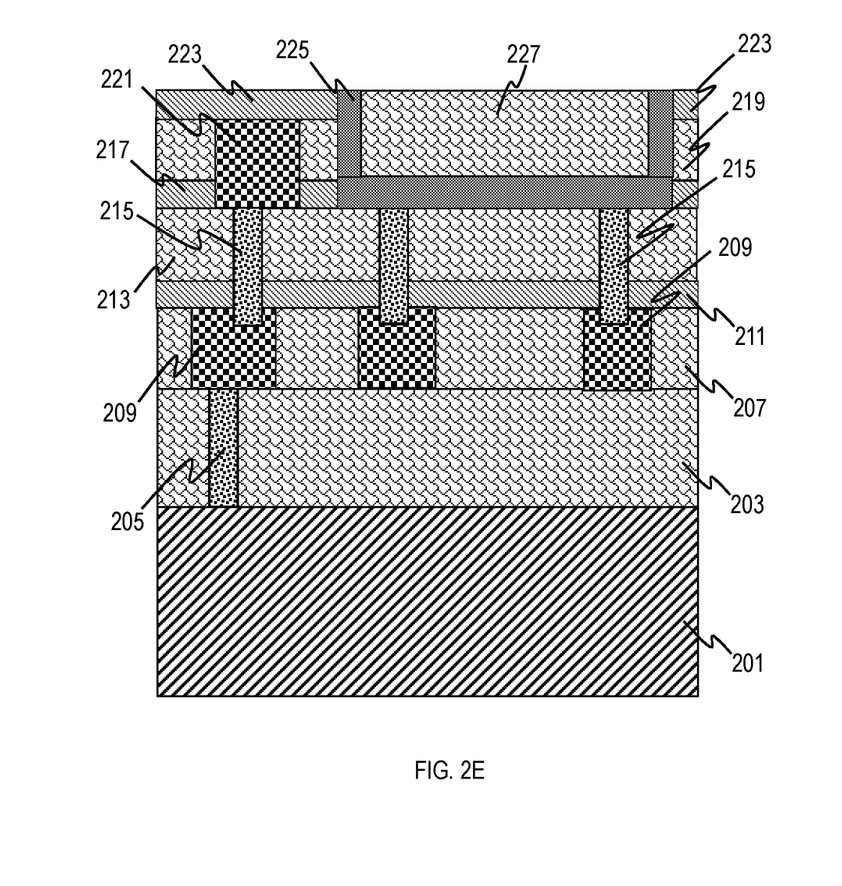
Figure 2F:
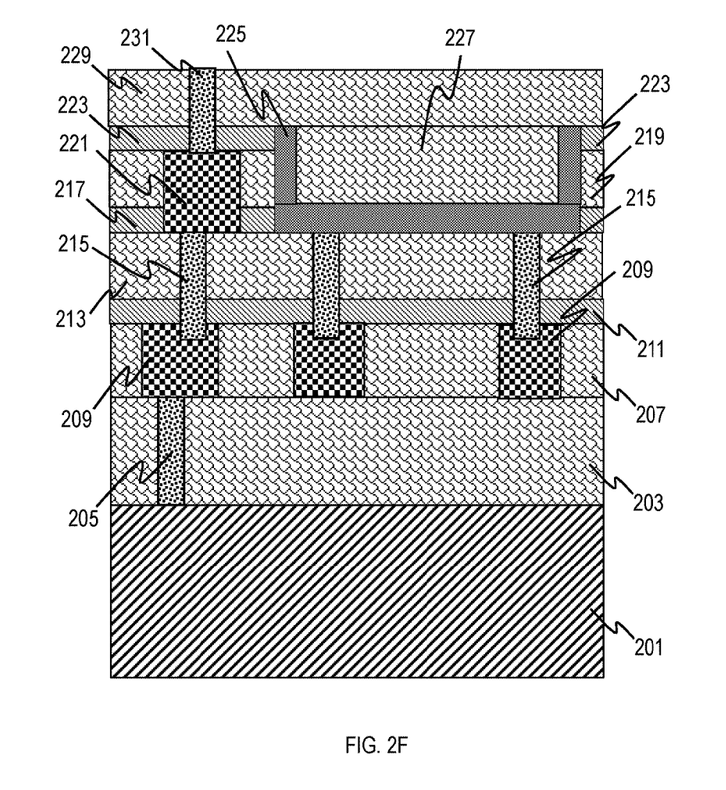

Adverting to FIG. 2D, portions of the nitride layer 223, the ILD 219 and the nitride layer 217 over two of the vias 215 are removed to form a trench over two vias 215 and the ILD 213 therebetween. Then, a TFR layer 225 is formed to a thickness of 50 Å to 2,000 Å over the nitride layer 223 and side and bottom surfaces of the trench. The TFR layer 225 is formed of good resistor material like Ta, TaN, SiCr, or NiCr. Next, an ILD 227 is formed to a thickness of 3,000 Å to 20,000 Å over the TFR layer 225. As shown in FIG. 2E, ILD 227 and the TFR layer 225 are planarized by CMP stopping on the nitride layer 223. Adverting to FIG. 2F, an ILD 229 is formed to a thickness of 3,000 Å to 20,000 Å over the nitride layer 223, the TFR layer 225 and the ILD 227. Then, vias 231 are formed through the ILD 229 and the nitride layer 223 and filled with metal to couple to the metal layer 221. TFR alternatively may be formed over the contacts rather than over the vias for electrical connection.

The embodiments of the present disclosure can achieve several technical effects, for example, high resistivity, improved reliability and electrical property of TFRs, since the TFR is formed on contacts or vias rather than contacts or vias being formed on top of the TFR material. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated finFET semiconductor devices with TFR structures, and particularly with the 0.13 micrometer (μm) pure bipolar-CMOS-DMOS (BCD) process.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a first interlayer dielectric (ILD) over a substrate;
   forming a second ILD over the first ILD;
   forming a first metal layer in the second ILD;
   forming a first nitride layer over the second ILD and the first metal layer;
   forming a third ILD over the first nitride layer;
   forming vias through the third ILD and the first nitride layer, coupled to the first metal layer;
   forming a thin film resistor (TFR) layer over two of the vias and the third ILD between the two vias;
   forming a second nitride layer over the TFR layer and the third ILD, wherein the second nitride layer covers an upper surface and side surfaces of the TFR layer in their entirety;
   forming a fourth ILD over the second nitride layer; and
   forming a second metal layer in the fourth ILD and the second nitride layer, wherein the second metal layer extends through the second nitride layer, and wherein the second metal layer is in direct contact with the third ILD and a third via.

2. A method according to claim 1, comprising forming the first metal layer by a single damascene process.

3. A method according to claim 1, comprising forming the second metal layer by a single or dual damascene process.

4. A method according to claim 1, comprising forming each of the first and second metal layers to a thickness of 2,000 Angstrom (Å) to 10,000 Å.

5. A method according to claim 1, comprising forming each of the first and the second nitride layers of silicon nitride ($Si_3N_4$) and to a thickness of 300 Å to 1,000 Å.

6. A method according to claim 1, comprising forming the TFR layer of tantalum (Ta), tantalum nitride (TaN), silicon chromium (SiCr), or nickel chromium (NiCr) and to a thickness of 50 Å to 2,000 Å.

* * * * *